United States Patent
Szczechowski et al.

(10) Patent No.: US 9,753,078 B2
(45) Date of Patent: Sep. 5, 2017

(54) TEST SYSTEM FOR HIGH-VOLTAGE COMPONENTS

(71) Applicant: ABB Technology AG, Zürich (CH)

(72) Inventors: Janusz Szczechowski, Leipzig (DE); Matthias Steiger, Bitterfeld-Wolfen OT Holzweißig (DE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/512,710

(22) Filed: Oct. 13, 2014

(65) Prior Publication Data
US 2015/0109017 A1 Apr. 23, 2015

(30) Foreign Application Priority Data
Oct. 18, 2013 (EP) .................................... 13004987

(51) Int. Cl.
*G01R 31/12* (2006.01)
*G01R 31/02* (2006.01)

(52) U.S. Cl.
CPC ....... *G01R 31/1227* (2013.01); *G01R 31/027* (2013.01)

(58) Field of Classification Search
CPC ..... G01R 31/12; G01R 19/00; G01R 19/0092
See application file for complete search history.

(56) References Cited

U.S. PATENT DOCUMENTS

| | | | | |
|---|---|---|---|---|
| 5,933,012 A | * | 8/1999 | Bengtsson | G01R 15/181 324/524 |
| 6,345,236 B1 | * | 2/2002 | Bertheau | G01R 35/00 702/107 |
| 2003/0038016 A1 | * | 2/2003 | Hilal | G01R 1/206 200/1 R |
| 2007/0070583 A1 | * | 3/2007 | Callsen | H02B 7/06 361/603 |

(Continued)

FOREIGN PATENT DOCUMENTS

| JP | 11-211782 A | | 8/1999 |
|---|---|---|---|
| JP | 2012202790 | * | 10/2012 |
| WO | WO 2012/097825 A1 | | 7/2012 |

OTHER PUBLICATIONS

European Search Report dated Apr. 1, 2014, for European Application No. 13004987.

(Continued)

*Primary Examiner* — Giovanni Astacio-Oquendo
*Assistant Examiner* — Alvaro Fortich
(74) *Attorney, Agent, or Firm* — Barnes & Thornburg LLP

(57) ABSTRACT

An exemplary test arrangement for in-situ partial discharge measurements in distribution transformers has at least one test system with a plurality of test components including: an AC voltage source for producing a variable test voltage with a measuring apparatus for recording current pulses caused by partial discharge and with an evaluation apparatus for the recorded current pulses, a grounded test container in which (Continued)

at least some of the test components are arranged, and a distribution transformer connected to the AC voltage source as a test object. The test object is arranged on insulation means for electrically insulating the test object. Those parts of the test object which are grounded during normal operation being connected at least to the potential of the grounded test container.

19 Claims, 2 Drawing Sheets

(56) References Cited

U.S. PATENT DOCUMENTS

| | | | | |
|---|---|---|---|---|
| 2007/0171958 | A1* | 7/2007 | Hoang | G01J 1/58 374/161 |
| 2010/0003415 | A1* | 1/2010 | Fu | C04B 41/009 427/372.2 |
| 2011/0121853 | A1* | 5/2011 | Werle | G01R 31/021 324/757.01 |
| 2011/0133749 | A1* | 6/2011 | Werle | G01R 31/021 324/537 |
| 2011/0133754 | A1* | 6/2011 | Werle | G01R 31/1227 324/555 |
| 2012/0019965 | A1* | 1/2012 | Faxvog | H02H 3/52 361/42 |
| 2012/0130663 | A1* | 5/2012 | Madhukar | G01R 31/027 702/65 |
| 2012/0139556 | A1* | 6/2012 | Annowsky | G01R 31/1227 324/547 |
| 2012/0293964 | A1* | 11/2012 | Greuter | H01L 23/3735 361/728 |
| 2012/0306511 | A1* | 12/2012 | Li | G01R 31/1227 324/555 |
| 2014/0112032 | A1 | 4/2014 | Parkhou et al. | |

OTHER PUBLICATIONS

Hässig et al., "Grundsteine der TE-Messung an Transformatoren vor Ort Erfahrungen aus off-line-Messungen", Highvolt Kolloquium '03, Jan. 1, 2003, Seite 207, XP055111326. (10 pages).

* cited by examiner

TEST SYSTEM FOR HIGH-VOLTAGE COMPONENTS

RELATED APPLICATION(S)

This application claims priority under 35 U.S.C. §119 to European application no. 13004987.7 filed in Europe on Oct. 18, 2013, the content of which is hereby incorporated by reference in its entirety.

FIELD

The present disclosure relates to a test arrangement for in-situ partial discharge measurements in distribution transformers, including at least one test system having at least an AC voltage source, a earthed (e.g., grounded) test container, and a distribution transformer connected to the AC voltage source. The AC voltage source has a measuring apparatus and an evaluation apparatus.

BACKGROUND INFORMATION

Known high-voltage components, for example distribution transformers, can have nominal voltages in the range of 10 kV to 110 kV for a power rating of several 100 kVA to 10 MVA, for example, and more. Distribution transformers have a considerable weight of several tons, for example, and are not operated redundantly in many cases. Nevertheless, such distribution transformers are subjected to a test at specified intervals in order to determine the extent to which they satisfy the specifications imposed on grid operation, such as those conditions with respect to an expected failure probability. A routine part of such tests is also a partial discharge measurement.

The partial discharge measurement is one of the most important non-destructive methods for detecting insulation faults. The disruptive discharge of an insulation material is known to occur at an internal weak point which could have previously exhibited partial discharge activity. For this reason, the measurement of partial discharges can help to prevent cost-intensive damage. The partial discharge measurement is therefore used for quality tests and for diagnosis in the factory and during in-situ testing of cables, geographic information system (GIS), power transformers or measuring transducers.

In this case, the in-situ testing of distribution transformers is important because both transportation of the distribution transformer to a test laboratory is avoided and downtimes caused by the testing can be considerably reduced.

In addition to a suitable voltage source and the test object itself, the main components of an in-situ partial discharge measuring system are a coupling capacitance, a high-frequency current transformer (partial discharge sensors), a spectrum analyser for a digital pulse recording system, a digital pulse recording system and a storage oscilloscope.

Further principles of the in-situ partial discharge measurements are described, for example, in *"Grundsteine der TE-Messung an Transformatoren: Vor-Ort Erfahrungen aus offline-Messungen"* [Foundations of partial discharge measurement on transformers: In-situ experience from offline measurements], Martin Hässig, FKH Jitka Fuhr, ABB Thomas Aschwanden, BKW FMB Energie AG.

The disadvantage of an in-situ partial discharge measurement proves to be the fact that the degree of difficulty in interpreting the results of a partial discharge measurement depends on the manifestation, e.g., the behavior of the partial discharge activity in the time and frequency domains, the partial discharge pattern and the temporal stability.

SUMMARY

An exemplary test arrangement for in-situ partial discharge measurements in distribution transformers is disclosed, comprising: a test system having a plurality of test components including: an AC voltage source for producing a variable test voltage; a measuring apparatus for recording current pulses caused by partial discharge; an evaluation apparatus for the recorded current pulses; a grounded test container in which at least some of the test components are arranged; and a distribution transformer connected to the AC voltage source as a test object, wherein the test object is supported on insulation means that electrically insulates the test object, and at least one of the plurality of test objects is grounded during normal operation and is connected to at least a potential of the grounded test container.

An exemplary method for constructing a test arrangement is disclosed. The test arrangement having a test system with a plurality of test components including: an AC voltage source for producing a variable test voltage; a measuring apparatus for recording current pulses caused by partial discharge; an evaluation apparatus for the recorded current pulses; a grounded test container in which at least some of the test components are arranged; and a distribution transformer connected to the AC voltage source as a test object, wherein the test object is supported on insulation means that electrically insulates the test object, the method comprising: arranging the test system with the test container in a vicinity of the test object; lifting the test object using a lifting tool; positioning the insulation means under the test object; lowering the test object onto the insulation means; electrically connecting the test components; and electrically connecting a ground potential of the test container to at least one of the plurality of test components of the test object which are grounded during normal operation.

BRIEF DESCRIPTION OF THE DRAWINGS

The disclosure, further embodiments and further advantages shall be described in more detail using the exemplary embodiments illustrated in the drawings, in which.

DETAILED DESCRIPTION

Figure 1:
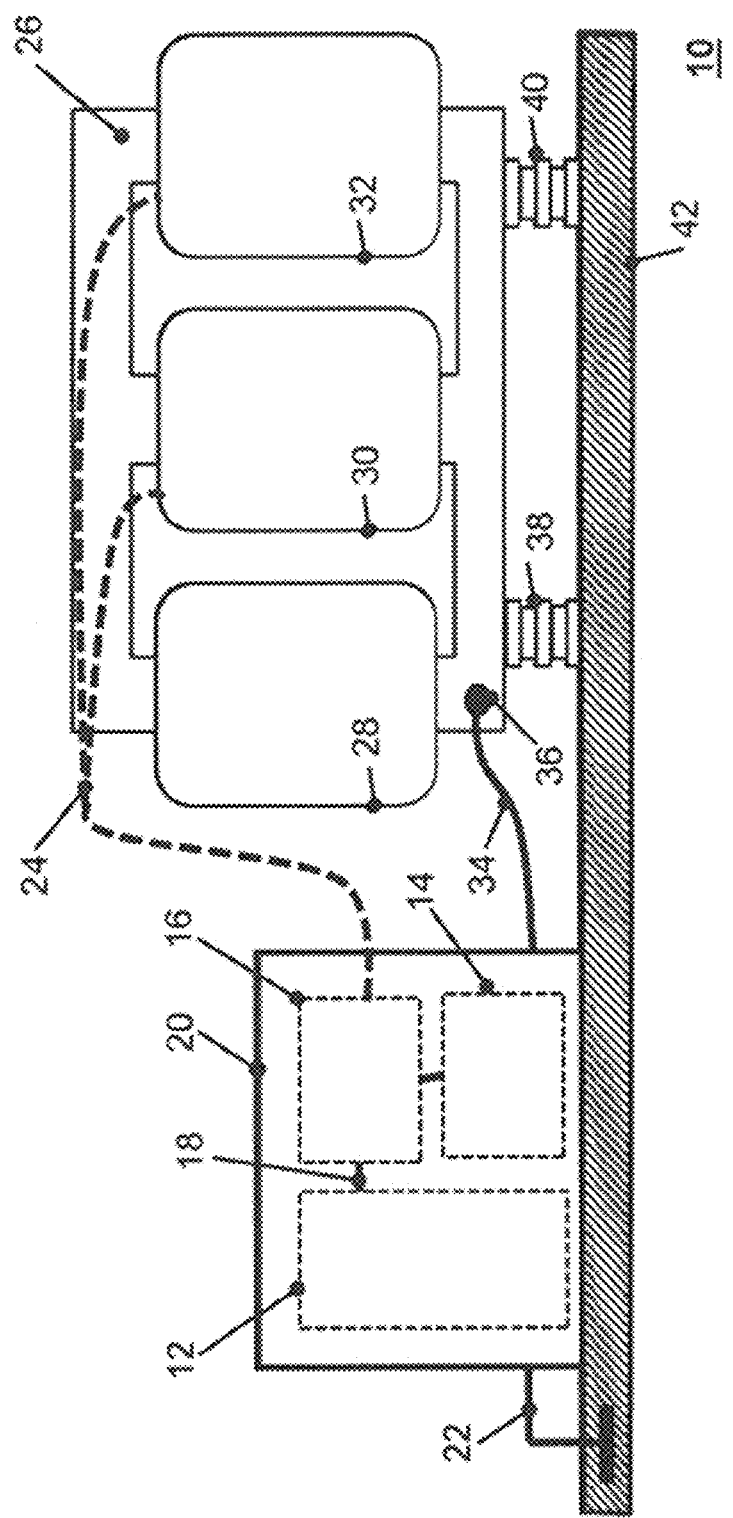
FIG. 1 shows an exemplary test arrangement according to an exemplary embodiment of the disclosure.

Exemplary embodiments of the present disclosure provide a test system for in-situ partial discharge measurements, which makes it possible to measure partial discharge activities with a high degree of temporal stability, in which case the measured values can be compared over an extended period which can be as long as possible.

According to an exemplary embodiment a test system for high-voltage components includes insulation means on which the test object is arranged in an electrically insulated manner, and in that those parts of the test object which are earthed (e.g., grounded) during normal operation are connected at least to the potential of the earthed test container.

The exemplary embodiments described herein eliminate interfering external influences, which could have an adverse effect on the measurement results, by disconnecting the test object, e.g., a high-voltage transformer, from the direct earth potential and connecting it to the earth potential of the test system which can be arranged at least with some of its components in a test container. The test container is in turn connected to earth. Exemplary components of a test object which are usually connected to earth potential are, for example, a transformer core and fastening and mounting means for the latter. In an exemplary embodiment of the present disclosure, the exemplary components do not include electrical windings.

Therefore, no transfer of the earth potential or injection of interference between the test container and the test object can be affected, thus advantageously reducing noise and interfering influences which could have an adverse effect on a partial discharge measurement. Optionally, the test container can be initially arranged in an insulating manner and can be connected to earth potential using a separate earthing line. This procedure is also equally suitable for the test components which are possibly not arranged in the test container.

According to an exemplary embodiment of the present disclosure, a sheath made of a conductive material which at least predominantly surrounds the test object is provided at a distance from the latter, for example at least 20 cm to 50 cm depending on the voltage level. The sheath can be connected to earth (e.g., ground) potential or to the earth potential of the test container. This advantageously reduces interfering external influences which could have an adverse effect on the quality of the measured values from a partial discharge measurement.

According to another exemplary embodiment of the present disclosure, the sheath is a tent made of a conductive film. The tent can have a framework-like supporting structure around which the conductive film is arranged. The distance between the film and the test object is such that a disruptive discharge between live components of the test object and the film is excluded. Direct contact between the film and components of the test object can be avoided even if they are connected to earth potential or earth potential of the test container, for example a transformer core.

Exemplary embodiments of the present disclosure provide a method for constructing a test arrangement. The method including arranging the test system with the test container in the vicinity of the test object, lifting the test object using a lifting tool, positioning insulation means under the test object, lowering the test object onto the insulation means, electrically connecting the test components, electrically connecting the earth potential of the test container to those parts of the test object which are earthed (e.g., grounded) during normal operation.

The advantages according to the disclosure, namely for example a reduction in the injection of noise and interference via the earth connection, have already been explained above. Depending on the size and weight of the test object, one or more pallet trucks, for example, are suitable as the lifting tool. Insulation blocks made of ceramic, plastic or pressboard, for example, are possible as insulation means. They can optionally have circumferential ribs in order to extend the creepage path. A suitable height of an insulation means is 5 cm to 25 cm, for example, depending on the voltage level.

FIG. 1 shows an exemplary test arrangement according to an exemplary embodiment of the disclosure. As shown in FIG. 1, an exemplary test arrangement 10 can include a test container 20 made of a conductive material, for example stainless steel, that is arranged on a standing area 42, such as the floor of a hall (e.g., building, structure). The test container 20 can be connected to earth potential by means of earthing 22. An AC voltage source 12, an evaluation apparatus 14 and a step-up transformer 16 are arranged, by way of example, inside the test container 20 and are connected to form an operational test system by means of electrical connections 18.

A transformer to be tested, which is illustrated with its components of the transformer core 26 and coils 28, 30, 32, can be arranged on the standing area 42. The transformer is arranged on insulation means 38, 40, with the result that the transformer core 26 which is usually earthed is insulated with respect to earth. In this case, the insulation means 38, 40 are ribbed ceramic insulators with a height of 20 cm, for example.

Electrical connecting lines 24 are provided between the test system arranged in the test container 20 and the windings 28, 30, 32 of the transformer in order to include the transformer in the test arrangement as a test object. Furthermore, the earth connection 36 of the transformer is currently not directly connected to earth potential but rather is connected to the test container 20 via a connecting line 34 and is therefore also connected to the electrical potential of the test container. This advantageously reduces injection of noise or other interfering influences, thus increasing the quality of the measurement results.

Figure 2:
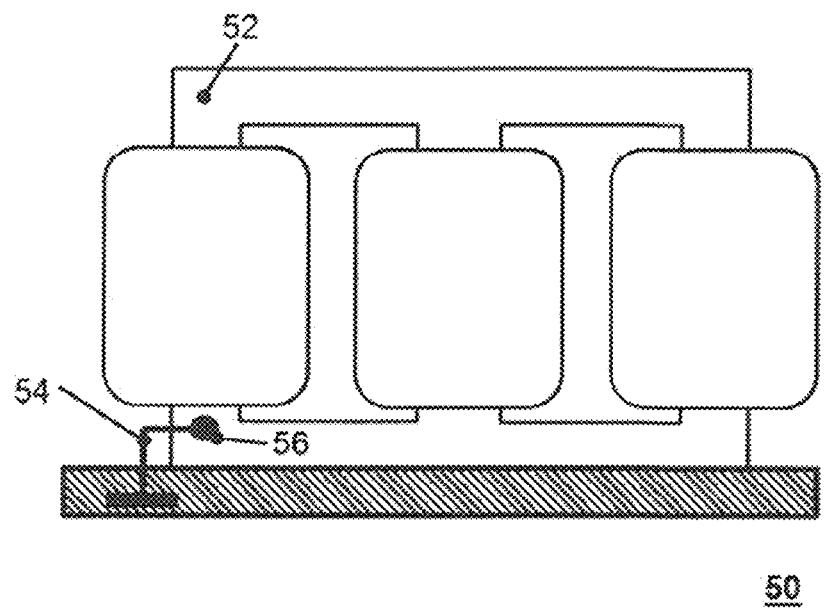
FIG. 2 shows an exemplary grounded test object according to a known implementation.

FIG. 2 shows an exemplary grounded test object according to a known implementation. As shown in FIG. 2, the exemplary test object 50 can include a transformer with a transformer core 52 and windings arranged in its limbs. The transformer core 52 can be arranged on (e.g., directly connected to) a standing area that is connected to earth (e.g., ground) through an earth (e.g., ground) connection 56. A partial discharge measurement on a transformer arranged in this manner would result in a high injection of noise and interference signals which would have a disadvantageous effect on a partial discharge measurement.

Figure 3:
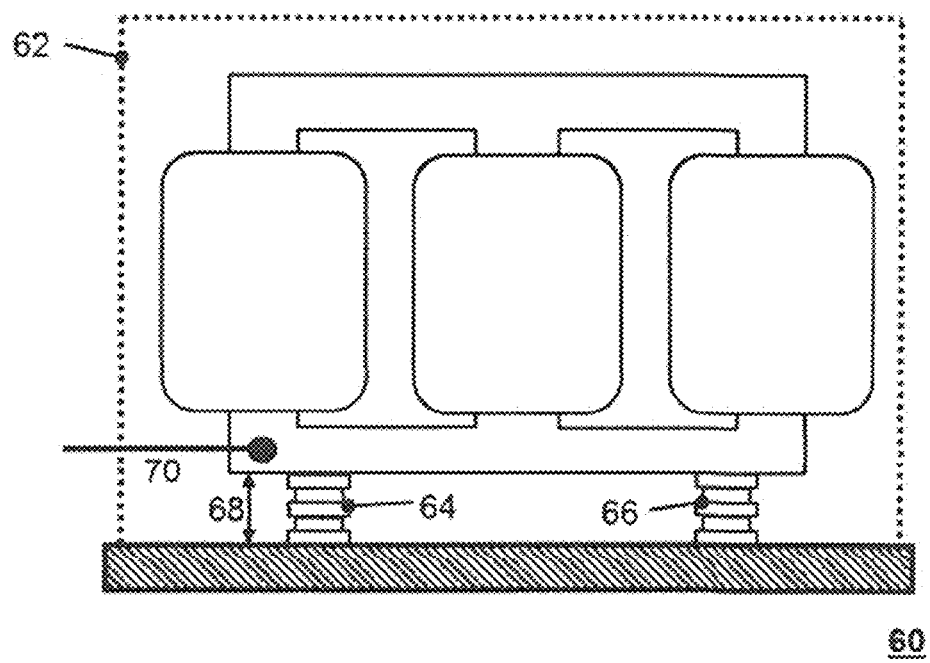
FIG. 3 shows an exemplary test object supported on insulation means according to an exemplary embodiment of the disclosure.

FIG. 3 shows an exemplary test object on insulation means according to an exemplary embodiment of the disclosure. FIG. 3 illustrates an exemplary test object 60 that includes a transformer on insulation means 64, 66. The elevated arrangement of the test object 60 on the insulation means 64, 66, for example insulation blocks made of pressboard, forms a distance 68 which ensures that the transformer is electrically insulated with respect to its standing area. The transformer core is connected to the earth (e.g., ground) potential of a test container of a test system (not shown) via a connecting line 70. A surrounding sheath, e.g., a tent made of a conductive tarpaulin, can be arranged around the transformer at a specified distance from the transformer. According to the exemplary embodiments disclosed herein, the risk of an interference signal being injected into the system between the test container and the test object can be reduced.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

10 Exemplary test arrangement
12 AC voltage source

14 Evaluation apparatus
16 Step-up transformer
18 Electrical connection
20 Test container
22 Grounding of the test container
24 Electrical connection
26 Transformer core
28 First coil
30 Second coil
32 Third coil
34 Test container connecting line
36 Test object earthing connection
38 First insulation means of test object
40 Second insulation means of test object
42 Standing area
50 Exemplary test object with earthing
52 Transformer core
54 Test object earthing
56 Test object earthing connection
60 Exemplary test object on insulation means
62 Surrounding sheath
64 First insulation means of test object
66 Second insulation means of test object
68 Distance
70 Test container connecting line

What is claimed is:

1. A test arrangement for in-situ partial discharge measurements in distribution transformers, comprising:
a test system having a plurality of test components including:
an AC voltage source for producing a variable test voltage;
a measuring apparatus for recording current pulses caused by partial discharge; and
an evaluation apparatus for the recorded current pulses;
an electrically-grounded test container in which at least some of the test components are arranged; and
a distribution transformer connected to the AC voltage source as a test object,
wherein the distribution transformer is supported on insulation means that electrically insulates the distribution transformer, and at least one of the plurality of test components is grounded during normal operation and is connected to at least a potential of the electrically-grounded test container.

2. The test arrangement according to claim 1, wherein a sheath made of a conductive material surrounds at least the distribution transformer and is provided at a distance from the distribution transformer.

3. The test arrangement according to claim 2, wherein the sheath is a tent made of a conductive film.

4. A method for constructing a test arrangement comprising (i) a test system having a plurality of test components including an AC voltage source for producing a variable test voltage, a measuring apparatus for recording current pulses caused by partial discharge, and an evaluation apparatus for the recorded current pulses, (ii) an electrically-grounded test container in which at least one of the test components are arranged, and (iii)
a distribution transformer connected to the AC voltage source as a test object, wherein the distribution transformer is supported on insulation means that electrically insulates the distribution transformer, the method comprising:
arranging the test system with the electrically-grounded test container in a vicinity of the distribution transformer;
lifting the distribution transformer using a lifting tool;
positioning the insulation means under the distribution transformer;
lowering the distribution transformer onto the insulation means;
electrically connecting the test components; and
electrically connecting a ground potential of the electrically-grounded test container to at least one of the plurality of test components of the test object distribution transformer which are grounded during normal operation.

5. The test arrangement according to claim 1, wherein the distribution transformer is arranged on a standing area and the insulation means establishes a distance between the distribution transformer and the standing area such that the distribution transformer is electrically insulated with respect to the standing area.

6. A test arrangement for in-situ partial discharge measurements in distribution transformers, comprising:
a test system including an electrically-grounded test container and a plurality of test components arranged within the electrically-grounded test container, the plurality of test components including an AC voltage source for producing a variable test voltage, a measuring apparatus for recording current pulses caused by partial discharge, an evaluation apparatus for the recorded current pulses;
a distribution transformer arranged as a test object connected to the AC voltage source; and
an insulator supporting the distribution transformer to electrically insulate the distribution transformer;
wherein the distribution transformer is electrically grounded through the electrically-grounded test container.

7. The test arrangement according to claim 6, wherein the distribution transformer is arranged on a standing area and the insulator supports the distribution transformer at a distance relative to the standing area to electrically insulate the distribution transformer relative to the standing area.

8. The test arrangement according to claim 7, wherein the insulator includes ceramic and the distribution transformer is only grounded through the electrically-grounded test container.

9. The test arrangement according to claim 1, wherein the insulator includes ceramic.

10. The test arrangement according to claim 1, wherein the distribution transformer is grounded through the electrically-grounded test container.

11. The test arrangement according to claim 1, wherein a connection line extends between the distribution transformer and the electrically-grounded test container.

12. The test arrangement according to claim 2, wherein the sheath is arranged to reduce the risk of interference signal between the test container and the transformer.

13. The test arrangement according to claim 2, wherein the sheath comprises tarpaulin.

14. The test arrangement according to claim 1, wherein the distribution transformer includes a transformer core and a number of coils.

15. The test arrangement according to claim 14, wherein the number of coils are electrically connected with the electrically-grounded test container by connecting lines.

16. The test arrangement according to claim 14, wherein the number of coils are electrically connected with a step-up transformer of the test system.

17. The test arrangement according to claim 1, wherein the evaluation apparatus is arranged within the electrically-grounded test container.

18. The test arrangement according to claim 1, wherein each of the AC voltage source, the measuring apparatus, and the evaluation apparatus is arranged within the electrically-grounded test container.

19. The test arrangement according to claim 5, wherein the distribution transformer includes a transformer core and a number of coils and the distance is defined between the core and the standing area.

\* \* \* \* \*